United States Patent [19]

Sato et al.

[11] Patent Number: 4,839,669
[45] Date of Patent: Jun. 13, 1989

[54] LIQUID JET RECORDING HEAD

[75] Inventors: Yasufumi Sato; Megumi Munakata; Hiromichi Noguchi, all of Atsugi, Japan

[73] Assignee: Canon Kabushiki Kaisha, Tokyo, Japan

[21] Appl. No.: 30,377

[22] Filed: Mar. 26, 1987

[30] Foreign Application Priority Data

Oct. 13, 1986 [JP] Japan .................. 61-241387

[51] Int. Cl.$^4$ .......................... G01D 15/18
[52] U.S. Cl. .................. 346/140 R; 156/273.3
[58] Field of Search ............. 525/289, 290, 910, 913, 525/279; 522/92, 102, 14, 36, 43, 46, 48, 63, 33, 59, 68, 77, 121, 106, 95; 156/273.3; 346/140 R

[56] References Cited

U.S. PATENT DOCUMENTS

| | | | |
|---|---|---|---|
| 3,655,826 | 4/1972 | Fellmann | 525/289 |
| 3,711,575 | 1/1973 | Kakefuda | 525/290 |
| 4,412,224 | 10/1983 | Sugitani | 346/140 |
| 4,533,975 | 8/1985 | Bill | 522/92 |
| 4,554,322 | 11/1985 | Kwiecinski | 525/290 |
| 4,688,052 | 8/1987 | Inamoto | 346/140 R |
| 4,688,053 | 8/1987 | Noguchi | 346/140 R |
| 4,688,054 | 8/1987 | Inamoto | 346/140 R |
| 4,688,055 | 8/1987 | Noguchi | 346/140 R |
| 4,688,056 | 8/1987 | Noguchi | 346/140 R |

FOREIGN PATENT DOCUMENTS

| | | | |
|---|---|---|---|
| 047865 | 1/1972 | Japan | 525/289 |
| 087409 | 11/1980 | Japan | 522/92 |

*Primary Examiner*—John C. Bleutge
*Assistant Examiner*—David Buttner
*Attorney, Agent, or Firm*—Fitzpatrick, Cella, Harper & Scinto

[57] ABSTRACT

A liquid jet recording head, having a liquid pathway communicated to the discharging outlet of the liquid provided on a substrate surface, said pathway being formed by subjecting a layer of a resin composition curable with an active energy ray to a predetermined pattern exposure with the use of said active energy ray to thereby form a cured region of said resin composition and removing the uncured region from said layer, said resin composition being an active energy ray curable resin composition comprising;

(A) a graft copolymerized polymer comprises; trunk chains composed mainly of structural units as monomer represented by the general formula (I) shown below:

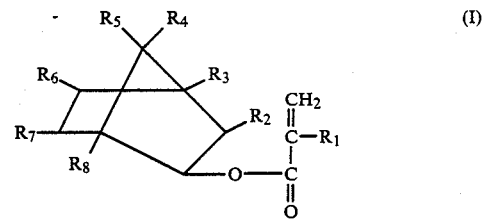

(wherein $R_1$ to $R_8$ each represent hydrogen or methyl group) and at least one monomer selected from the group consisting of alkyl (meth)acrylate, acrylonitride and styrene, having graft chains composed mainly of structural units derived from at least one monomer selected from the group consisting of (a) hydroxyl containing(meth) arcylic monomers, (b) amino or alkylamino containing (meth)acrylic monomer, (c) carboxyl containing(meth) acrylic or vinyl monomers, (d) N-vinylpyrrolidone, (e) vinylpyridine or its derivatives and (f) (meth) acrylamide derivatives represented by the following general formula(II):

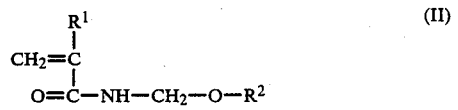

(wherein $R^1$ is hydrogen or methyl group, and $R^2$ is hydrogen or alkyl or acyl group having 1 to 4 carbon atoms which may have hydroxy group.), added to said trunk chains; and (B) a monomer having an ethylenically unsaturated bond.

22 Claims, 4 Drawing Sheets

LIQUID JET RECORDING HEAD

BACKGROUND OF THE INVENTION

1. Field of the Invention

This invention relates to a liquid jet recording head, more particularly to a recording head for generation of small droplets of a liquid for recording to be used in a liquid jet recording system in which recording is performed by generating small droplets of a liquid for recording such as ink, etc., and attaching them onto a recording medium such as paper.

2. Related Background Art

The liquid jet recording system which performs recording by generating small droplets of a liquid for recording such as-ink, etc., and attaching them onto a recording medium such as paper is attracting attention as the recording system which is extremely small to negligible extent in generation of noize during recording, and also capable of high speed recording and further enables recording on a plain paper without requiring any special treatment such as fixing, and various types of this system have been actively studied.

The recording head portion of the recording device to be used in the liquid jet recording system generally consists of an orifice for discharging a liquid for recording (liquid discharging outlet), a liquid pathway connected to the orifice and having a portion at which the energy for discharging the liquid for recording acts on the liquid for recording and a liquid chamber for storing the liquid for recording to be fed into the liquid pathway.

The energy for discharging the liquid for recording during recording is generated in most cases by means of a discharge energy generating element of various types such as heat generating element, piezoelectric element, etc., which is arranged at a predetermined position at the portion where the discharging energy is permitted to act on the liquid for recording which constitutes a part of the liquid pathway (energy acting portion).

As the method for preparing the liquid jet recording head with such a constitution, there have been known, for example, the method comprising the steps of forming fine grooves on a flat plate of glass, metal, etc., by cutting or etching and bonding another appropriate plate onto the flat plate having such grooves formed thereon to thereby form liquid pathways or the method comprising the steps of forming groove walls of a cured photosensitive resin on a substrate having a discharging energy generating element arranged thereon according to the photolithographic step to provide grooves for the liquid pathways on the substrate and bonding another flat plate (covering) onto the grooved plate thus formed to thereby form liquid pathways (for example, Japanese Laid-open Patent Application No. 43876/1982).

Of these methods for preparation of the liquid jet recording heads, the latter method employing a photosensitive resin is more advantageous than the former method in that liquid jet recording heads can be provided with better quality and cheaper cost because it enables fine working with better precision and better yield and bulk production with ease.

As the photosensitive resin to be used in preparation of such recording heads, there have been employed those used for pattern formation in printing plates or printed wiring or those known as the photocurable coating materials or adhesives to be used for glass, metal, ceramics, etc. Also, in aspect of working efficiency, dry film type resins have been primarily utilized.

In the recording head employing a cured film of a photosensitive resin, in order to obtain excellent characteristics such as high recording characteristic, durability and reliability, etc., the photosensitive resin to be used for the recording head is required to have the following characteristics:

(1) particularly, excellent adhesion as the cured film to a substrate;

(2) excellent mechanical strength and durability, etc., when cured; and (3) excellent sensitivity and resolution during patterning by use of pattern exposure light.

However, under the present situation, none of the photosensitive resins used for formation of the liquid jet recording head hitherto known in the art satisfy all of the above requisite characteristics.

To describe in more detail, those employed for pattern formation in printing plates, printed wirings, etc., as the photosensitive resin for recording head are inferior in adhesion or close contact with glass, ceramics, plastic film, etc., to be used as the substrate, although they are excellent in sensitivity and resolution, and also insufficient in mechanical strength and durability when cured. For this reason, as the stage of preparation of recording heads, or in the course during usage, there is involved the drawback that deformation of the resin cured film or peel-off from the substrate or damages are liable to occur, which may cause impairment markedly of reliability of the recording head such as lowering in recording characteristics by impeding the flow of the liquid for recording in the liquid pathways or making the liquid droplet discharging direction unstable.

On the other hand, those which are known as photocurable type coating materials or adhesives to be used for glass, metals, ceramics, etc., although having advantages of excellent close contact or adhesiveness with the substrate formed of these materials and also satisfactory mechanical strength and durability obtained when cured, are inferior in sensitivity and resolution and therefore requires an exposure device of higher intensity or an exposure operation for longer time Further, their inherent characteristics cannot afford providing precise and high density pattern with good resolution, whereby there is involved the problem that it is not suitable for a recording head for which minute precise working is particularly required

SUMMARY OF THE INVENTION

The present invention has been accomplished in view of the problems as described above and an object of the present invention is to provide a liquid jet recording head having a liquid pathway wall comprising a resin cured film satisfying all of the requisite characteristics as mentioned above, which is inexpensive, precise, high in reliability and excellent in durability.

Another object of the present invention is to provide a liquid jet recording head having a constitution of which the liquid pathway is minutely worked with good precision and good yield.

A further object of the present invention is to provide a liquid jet recording head which is high in reliability and excellent in durability even when formed into multi-orifices.

According to the present invention, there is provided a liquid jet recording head, having a liquid pathway communicated to the discharging outlet of the liquid provided on a substrate surface, said pathway being formed by subjecting a layer of a resin composition curable with an active energy ray to a predetermined pattern exposure with the use of said active energy ray to thereby form a cured region of said resin composition and removing the uncured region from said layer, said resin composition being an active energy ray-curable resin composition comprising;

(A) a graft copolymerized polymer comprising trunk chains composed mainly of structural units comprising a monomer represented by the general formula (I) shown below (wherein $R_1$ to $R_8$ each represent hydrogen or methyl group) and at least one monomer selected from the group consisting of alkyl (meth)acrylates, acrylonitrile and styrene, having graft chains composed mainly of structural units derived from at least one monomer selected from the group consisting of (a) hydroxyl containing (meth)acrylic monomers, (b) amino or alkylamino containing (meth)acrylic monomers, (c) carboxyl containing (meth)acrylic or vinyl monomers, (d) N-vinylpyrrolidone, (e) vinylpyridine or its derivatives and (f) (meth)acrylamide derivatives represented by the following general formula (II)

(wherein $R^1$ is hydrogen or methyl group, and $R^2$ is hydrogen or alkyl or acyl group having 1 to 4 carbon atoms which may have hydroxy group.), added to said trunk chains; and (B) a monomer having an ethylenically unsaturated bond.

DESCRIPTION OF THE PREFERRED EMBODIMENTS

That is, the recording head of the present invention comprises a substrate and a cured resin film layer for forming at least a groove which becomes liquid pathway, and it is recording head which is excellent in durability of the respective members constituting the recording head and adhesion between the respective members, and yet has excellent recording characteristics with the cured resin film layer being minutely worked with good precision, is also high in reliability and excellent in durability during usage.

In the following, the liquid jet recording head of the present invention is described in detail by referring to the drawings.

Figure 1A:
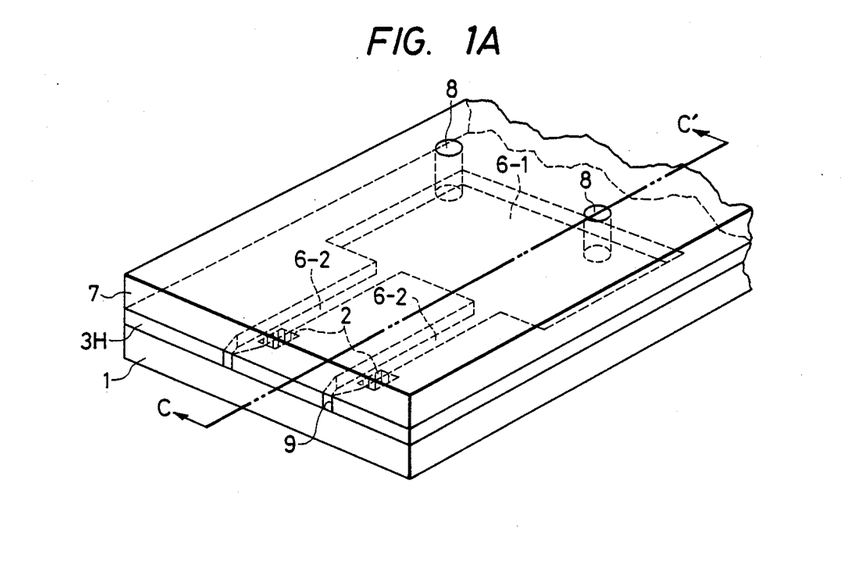
FIG. 1 to FIG. 6 are schematic illustrations for explanation of the liquid jet recording head of the present invention and the methods for producing the same.
Figure 1B:
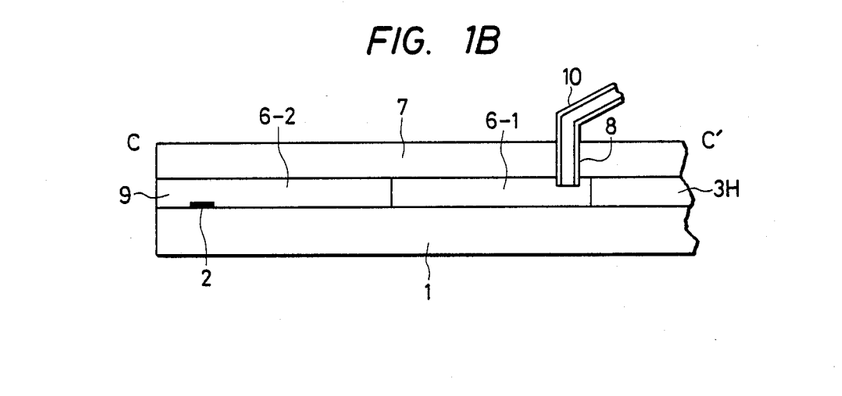

FIGS. 1A and 1B are an embodiment of the liquid recording head of the present invention, FIG. 1A showing a perspective view of the main portion thereof and FIG. 1B showing a sectional view of FIG. 1A cut along the line C—C'.

The liquid jet recording head comprises basically a substrate 1, a resin cured film 3H provided on said substrate 1 and subjected to patterning to a desired shape and a covering 7 laminated on said resin cured film 3H, and these members form an orifice 9 for discharging a liquid for recording, liquid pathways 6-2 communicated to said orifice 9 and having the portions at which the energy for discharging the liquid for recording acts on the liquid for recording and a liquid chamber 6-1 for storing the liquid for a recording to be supplied into said liquid pathways 6-2. Further, at the through-hole 8 provided on the covering 7, a feeding pipe 10 for feeding the liquid for recording into the liquid chamber 6-1 is bonded to the outside of the recording head. In FIG. 1A, the feeding pipe 10 is omitted.

During recording, the energy for discharging the liquid for recording is generated by applying discharging signals as desired on the discharge energy generating elements 2 of various types such as heat-generating elements, piezoelectric elements, etc., arranged at predetermined positions in the portions for acting the discharging energy on the liquid for recording constituting a part of the liquid patheays 6-2 through wirings (not shown) connected to these elements 2.

The substrate 1 constituting the recording head of the present invention comprises a glass, ceramics, plastic or metal and the generating elements 2 are arranged in a desired number at predetermined positions. In the embodiment of FIG. 1, two generating elements are provided, but the number and arrangement of the heat generating elements are determined depending on the desired constitution of the recording head.

On the other hand, the covering 7 comprises a flat plate of glass, ceramics, plastic or metal and is bonded onto the resin cured film 3H by fusion or adhesion with the use of an adhesive, and it is also provided with a through-hole 8 for connecting a feeding pipe 10 at a predetermined position.

In the recording head of the present invention, the resin cured film 3H subjected to patterning to a predetermined shape constituting the liquid pathways 6-2 and the liquid chamber 6-1 has been obtained by subjecting a layer comprising a resin composition with the composition as described below on the substrate 1 or on the covering 7 to patterning according to the photolithographic step. Also, said resin cured film 3H may also be subjected to patterning as integrated with the covering comprising a resin composition having the composition as described below.

The resin composition to be used for formation of a cured resin film provided on a substrate for constituting at least a portion which becomes the liquid pathway is an active energy ray curing type resin composition comprising:

(A) a graft copolymerized polymer comprising trunk chains composed mainly of structural units comprising a monomer represented by the general formula (I) shown below:

(I)

(wherein $R_1$ to $R_8$ each represent hydrogen or methyl group) and at least one monomer selected from the group consisting of alkyl (meth)acrylates, acrylonitrile and styrene, having graft chains composed mainly of structural units derived from at least one monomer selected from the group consisting of (a) hydroxyl containing (meth)-acrylic monomers, (b) amino or alkylamino containing (meth)acrylic or vinyl monomers, (d) N-vinylpyrrolidone,(e) vinylpyridine or its derivatives and (f) (meth)acrylamide derivatives represented by the following general formula (II):

(II)

(wherein $R^1$ is hydrogen or methyl group, and $R^2$ is hydrogen or alkyl or acyl group having 1 to 4 carbon atoms which may have hydroxy group.) added to said trunk chains; and (B) a monomer having an ethylenically unsaturated bond, having good adhesion to a substrate comprising glass, plastic, ceramics, etc., particularly when formed into a cured film, being also excellent in resistance to the liquid for recording such as ink as well as mechanical strength, and further having the excellent characteristic as the constituent member of a liquid jet recording head that a precise and high resolution pattern can be formed by patterning with an active energy ray. Further, the resin composition can be used as a dry film, and also in that case, the above excellent characteristics can be exhibited.

The composition of the active energy curing type resin composition to be used for formation of the recording head of the present invention is described in detail below. Throughout the specification, "(meth)acryloyl group", "(meth)acrylate" and "(meth)acryl" are inclusive of "acryloyl group and methacryloyl group", "acrylate and methacrylate", and "acryl and methacryl", respectively.

The graft copolyerized copolyer (A) which is the essential component of the active energy ray-curable resin composition of the present invention comprises graft chain composed mainly of the above monomers (a) to (f) having hydrophilic property which can exhibit excellent adhesiveness to a support grafted onto the trunk chain adapted for a structural material which is relatively rigid and excellent in heat resistance.

The (meth)acrylate derivative represented by the general formula (I) which is the essential component constituting the trunk chain of the above graft copolymer has the specific features of a very high glass transition point and low hygroscopicity, and imparts high heat resistance and durability to the composition used in the present invention.

The proportion of the (meth)acrylate derivative represented by the general formula (I) to be formulated may be preferably 1 to 60 wt. % of the whole monomers, particularly preferably within the range of from 1 to 30 wt. % when used as a dry film.

Another monomer constituting the trunk chain of the graft copolymer is an alkyl (meth)acrylate having 1 to 4 carbon atoms in the alkyl group such as methyl (meth)acrylate, ethyl (meth)acrylate, isobutyl (meth)acrylate, t-butyl (meth)acrylate, and the like, acrylonitrile and styrene.

The trunk chain may also be, in addition to those derived only from the above monomers, a trunk chain comprising, for example, methyl (meth)acrylate, ethyl (meth)acrylate, n-butyl (meth)acrylate, lauryl (meth)acrylate, 2-ethylhexyl (meth)acrylate, glycidyl (meth)acrylate, vinyl acetate, etc., added to the above monomers as the component for copolymerization at a proportion within the range of from 0 to about 50 wt. %. The above trunk chain in the composition used in the present invention gives high coagulating strength and heat resistance to the composition.

To show specific examples of the monomers constituting the graft chains of the graft copolymer in the present invention, as the hydroxyl containing (meth)acrylic monomer (a), there may be included 2-hydroxyethyl (meth)acrylate, 2-hydroxypropyl (meth)acrylate, 3-chloro-2-hydroxypropyl (meth)acrylate, 4-hydroxybutyl (meth)acrylate, 3-hydroxybutyl (meth)acrylate, 5-hydroxypentyl (meth)acrylate, 6-hydroxyhexyl (meth)acrylate; a monoester of 1,4-cyclohexanedimethanol and acrylic or methacrylic acid; a product known under a trade name of Aronix M5700 produced by Toa Gosei Kagaku Co., Ltd.; caprolactone acrylate known under a trade name of TONE M100 produced by Union Carbide Co.; a product known under a trade name of Light Ester HO-mpp produced by Kyoei Yushi Kagaku Co., Ltd.; 2-hydroxy-3-phenoxypropyl acrylate known under a trade name of Light Ester M-600A produced by Kyoei Yushi Kagaku Co., Ltd.; and monoesters of (meth)acrylic acid and dihydric alcohols such as 1,10-decandiol, neopentylglycol, bis(2-hydroxyethyl)terephthalate, addition products of bisphenol-A and ethylene oxide or propylene oxide, etc.

Examples of the amino- or alkylamino-group containing (meth)acrylic monomer (b) are (meth)acryl amide, N,N-dimethylaminoethyl-(meth)acryl amide, N,N-dimethyl(meth)acryl amide, N,N-dimethylaminopropyl-(meth)acryl amide, and N,N-di-t-butylaminoethyl-(meth)acryl amide.

Examples of the carboxyl group containing (meth) acrylic or vinyl monomer (c) are (meth)acrylic acid, fumaric acid, itaconic acid, and products known under a trade name of Aronix M-5400 or Aronix-M-5500 produced by Toa Gosei Kagaku Co., Ltd.

(d) N-vinylpyrrolidone.

Examples of the vinyl pyridine or derivative thereof (e) are 2-vinylpyridine, 4-vinylpyridine, 2-vinyl-6-methylpyridine, 4-vinyl-1-methylpyridine, 2-vinyl-5-ethylpyridine and 4-(4-piperidinoethyl)pyridine.

The above-mentioned mononers (a)-(d) and (e) are all hydrophilic and provide the composition used in the present invention with a strong adhesion to a substrate such as glass, ceramics, plastics etc.

As the (meth)acrylic amide derivative (f) represented by the formula (II), there may be included monomers which are hydrophilic and have heat crosslinkability such as N-methylol(meth)acrylamide,
N-propoxymethyl(meth)acrylamide,
N-n-butoxymethyl(meth)acrylamide.
β-hydroxyethoxymethyl(meth)acrylamide,
N-ethoxymethyl(meth)acrylamide,
N-methoxymethyl(meth)acrylamide, etc. These monomers (f) have hydrophilic property as a matter of course and also condensing crosslinkability by heating, and water molecules or alcohols are eliminated generally at a temperature of 100° C. or higher to form crosslinks, thereby forming a network structure after curing in the graft copolymer itself, whereby the pattern obtained by curing is further improved in chemical resistance and mechanical strength to make the present invention more effective.

Also, by constituting the graft chains by adding partially a monomer which is subjected to ring opening by heat to be crosslinked, for example, glycidyl (meth)acrylate, etc., to the above monomers (a) to (f), the same effect as in the above (f) can be obtained.

Other than the thermal crosslinking as described above, it is also effective to introduce a photopolymerizable monomer as a part of the graft chains of the graft copolymerized polymer in the present invention for the same purpose and crosslink the graft copolymer with an active energy ray.

As such methods for imparting photopolymerizability to the graft chains, there may be employed, for example, ⓐ the method in which a carboxyl containing monomer exemplified by (meth)acrylic acid, etc., or an amino or tertiary amino containing monomer is copolymerized, followed by the reaction with glycidyl(meth)acrylate, etc.;

ⓑ the method in which a compound having one isocyanate group and one or more (meth)acrylic ester groups in one molecule is reacted with the hydroxyl group, amino group or carboxyl group in the graft chain;

ⓒ the method in which (meth)acrylic acid chloride is reacted with the hydroxyl groups in the graft chain;

d the method in which an acid anhydride is reacted with the hydroxyl group in the graft chain, followed by the reaction with glycidyl(meth)acrylate;

ⓔ the method in which the hydroxyl group in the graft chain is condensed with the condensing cross linkable monomer as exemplified in (f), thereby leaving (meth)acrylamide group in the side chain;

ⓕ the method in which the hydroxyl group in the graft chain is reacted with glycidyl(meth)acrylate; etc.

When the graft chains in the graft copolymer of the present invention are heat-crosslinkable, it is preferable to effect heating after formation of a pattern by irradiation of an active energy ray. On the other hand, also in the case where the above graft chains are photopolymerizable, there is no problem in performing heating within the range permissible in aspect of heat resistance of the support, but rather more preferable results can be given.

The graft chains may be also graft chains comprising various hydrophobic monomers, etc., as the copolymer component within the range from 0 to about 25 wt. % for exhibiting various functions other than those derived only from hydrophilic monomers as exemplified above in (a)-(f).

The graft copolymers to be used in the present invention may be classified broadly into those having no curability, those which are photocrosslinkable and those which are heat crosslinkable, but all of them enable precise patterning by imparting to the composition form retentivity in the curing step of the composition of the present invention (namely curing by active energy ray irradiation and optional thermal curing), and also provide excellent adhesiveness, chemical resistance and high mechanical strength to the pattern obtained by curing.

The above graft copolymer to be used in the present invention can be produced according to known methods, specifically various methods as described in, for example, "Polymer Alloy, Base and Application" p.10-35 (edited by Kobunshi Gakkai, published by Tokyo Kagaku Dojin K.K.,1981). Examples of such methods may include (1) the chain transfer method, (2) the method by use of radiation, (3) the oxidative polymerization method, (4) the ion graft polymerization method, and (5) macromonomer method.

The graft copolymer to be used in the present invention can give more remarkable surfactant effect as the lengths of the graft chains are more regular, and therefore it is preferable to use the method of (4) or (5), particularly preferably the macromonomer method of (5) which is advantageous in designing of material. The weight average molecular weight of the graft copolymer may be preferably within the range of from about 5000 to 300000, and when used as a dry film, preferably within the range of from about 30000 to 300000.

The monomer (B) having an ethylenically unsaturated bond to be used as another component in the resin composition for formation of a cured resin film in the present invention is a component for permitting the composition of the present invention to exhibit curability with an active energy ray, preferably having a boiling point of 100° C. or higher under atmospheric pressure, also having two or more ethylenically unsaturated bonds, and various known monomers curable by irradiation of an active energy ray can be used.

Specific examples of such monomers having two or more ethylenically unsaturated bonds include (i) (meth)acrylic acid esters of polyfunctional epoxy resins having two or more epoxy groups in one molecule, (ii) (meth)acrylic acid esters of alkyleneoxide addition products of polyhydric alcohols, (iii) polyester (meth)acrylates having (meth)acrylic acid ester group at the terminal ends of the molecular chains of polyesters having molecular weights of 500 to 3000 comprising dibasic acid and dihydric alcohol, (iv) the reaction products between polyisocyanates and (meth)acrylic acid monomers having hydroxyl groups. The above monomers (i)-(iv) may be urethanemodified products having urethane bonds in the molecules.

Examples of the monomers belonging to (i) include (meth)acrylic acid esters of epoxy resins as represented by the bisphenol A type, bisphenol S type bisphenol F type, novolac type, alicyclic type, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula 111:

(wherein R represents an alkyl group or an oxyalkyl group, $R_0$ represents or an alkyl group).

Examples of the monomers belonging to (ii) include etyleneglycol di(meth)acrylate, diethyleneglycol (meth)acrylate, polyethyleneglycol di(meth)acrylate, 1,6-hexanediol (meth)acrylate, polyethleneglycol di(meth)acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K.K.), and also those known under the trade names of NK ester BPE-200, BPE-500, BPE-1300, A-BPE-4 (all produced by Shin Nakamura Kagaku K.K.), etc., may also be available.

The monomers belonging to (iii) may be exemplified by those known under the trade names of Aronix M-6100, M-6200, M-6250, M-6300, M-6400, M-7100, M-8030, M-8060, M-8100 (all produced by Toa Gosei Kagaku K.K.). Examples of the monomers belonging to (ii) and having urethane bonds of polyester include those known under the trade names of Aronix M-1100, Aronix M-1200, (both produced by Toa Gosei Kagaku K.K.).

The monomers belonging to (iv) may include the reaction products between polyisocyanate such as tolylene diisocyanate, isophorone diisocyanate, hexamethylene diisocyanate, trimethylhexanethylene dissocyanate, lysine diisocyanate, diphenylmethane diisocyanate of the like with a hydroxyl containing (metha)acrylic monomer, and it is possible to use the reaction products having (meth)acrylic acid esters containing hydroxyl group (s) added to polyisocyanate compounds known under the trade names of Sumidule N (buret derivative of hexanethylene diisocyanate), Sumidule L (trimethyolpropane modified product of tolylene diisocyanate)(all produced by Sumitomo Bayer Urethane K.K.), etc. The hydroxyl containing (meth)acrylic monomer as herein mentioned may preferably include hydroxyethyl (meth)acrylate and hydroxypropyl (meth)acrylate. It is also possible to use other (meth)acrylic monomers containing hydroxyl group(s) previously mentioned for the graft chain of the graft copolymer in the present specification.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may be included, for example, carboxyl containing unsaturated monomers such as (meth)acrylic acid or the like; glycidyl containing unsaturated monomers such as glycidyl (meth)acrylate or the like; $C_2$–$C_8$ hydroxyalkyl esters of (meth)acrylic acid such as, hydroxyethyl (meth)acrylate, hydroxypropyl (meth)acrylate or the like; monoesters of (meth)acrylic acid with polyethyleneglycol or polypropyleneglycol such as polyethylene-glycol mono(meth)acrylate, polypropyleneglycol mono(meth)acrylate or the like; $C_1$–$C_{12}$ alkyl or cycloalkyl esters of (meth)acrylic acid such as methyl(meth)acrylate, ethyl(meth)acrylate, propyl (meth)acrylate, isopropyl (meth)acrylate, butyl(meth)acrylate, hexyl (meth)acrylate, octyl (meth)acrylate, lauryl (meth)acrylate, cyclohexyl (meth)acrylate or the like; other monomers such as styrene vinyltoluene, methylstyrene, vinyl acetate. vinyl isobutyl ether, acrylonitrile, (meth)acrylamide. (meth)acrylic acid adduct of alkylglycidyl ether, vinylpyrrolidone, dicyclopentenyloxyethyl (meth)acrylate, ξ-caploractone-modified hydroxyalkyl (meth)acrylate, tetrahydrofurfuryl (meth)acrylate, phenoxyethyl (meth)acrylate: and others.

Anyway, by use of the above monomer having ethylenically unsaturated bond, curability with an active energy ray can be imparted to the resin composition for formation of a cured resin film in the present invention.

The active energy ray curable type resin composition for formation of a cured resin film used in the present invention should preferably contain a photopolymerization initiator added in the resin composition when an active energy ray with a wavelength of 250 nm to 40 nm is used as the active energy ray. As the photopolymerization initiator, known substances used for photopolymerization can be used without any particular limitation.

Specific examples of such photopolymerization initiators include benzil; and its derivatives benzoin alkyl ethers such as benzoin isobutyl ether, benzoin isopropyl ether, benzoin-n-butyl ether, benzoin ethyl ether, benzoin methylether and the like; benzophenones such as benzophenone, 4,4'-bis(N, N-diethylamino)benzophenone, benzophenone methyl ether and the like; anthraquinones such as 2-ethylanthraquinone, 2- t-butylanthraquinone and the like, xanthone such 2,4-dimethylthioxanthone, 2,4-diisopropylthioxanthone and the like; acetophenones such as 2,2 -dimethoxy-2-phenylacetophenone, α, α-dichloro-4-phenoxyacetophenone, p-tert-butyltrichloroacetophenone, p-tert-butyl dichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1 (4-isopropylphenyl)-2-hydroxy-2- methylpropane-1-one, (e.g. Darocure 1116, produced by MERCK Co.), 2-hydroxy-2-methyl-1 phenylpropane 1-one (Darocure 1173, produced by MERCK CO.); etc., as preferable ones. In addition to these photopolymerication initiators, amino compounds may be added as the photopolymerization accelerator.

The amino compounds to be used as the photopolymerization accelerator may include ethanolamine ethyl-4-dimethylaminobenzoate, 2-(dimethylamino)ethylbenzoate, p-dimethylaminobenzoic acid n-amylester, p-dimethylaminobenzoic acid isoamylester, etc.

The constitutional ratio of the above materials constituting the active energy ray-curable resin composition of the present invention may be made 20 to 80 parts by weight preferably 20 to 50 parts by weight for the graft copolymer and 80 to 20 parts by weight preferably 50 to 80 parts by weight for the monomer having ehylenically unsaturated bonds.

When a photopolymerization initiator is used in the resin composition of the present invention, the photopolymerization initiator may be used in an amount within the range from 0.1 to 20 parts by weight, preferably from 1 to 10 parts by weight based on 100 parts by weight of the resin components comprising the graft copolymer and the monomer having ethylenically unsaturated bonds.

As the solvent to be used when employing the active energy ray-curing resin composition of the present invention in the form of a solution or when coating the composition on a plastic film which is a film substrate in formation of a dry film, hydrophilic solvents such as alcohols, glycol ethers, glycol esters, etc., may be employed Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the resin composition after pattern exposure.

The active energy ray-curable resin composition of the present invention may further contain in addition to the above photopolymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant there can be added oil soluble dyes and pigments within the range which do not substantially prevent transmission the active energy ray. As the filter, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used in the present invention.

The resin composition comprising the composition as described above is cured with an active energy ray to form the resin cured film 3H possessed by the recording head of the present invention. Next, as an embodiment of the case when employing a dry film type as the resin composition for formation of the resin cured film 3H, the method for preparing the liquid jet recording head of the present invention is described in detail by referring to the drawings.

FIGS. 2 to 6 B are schematic illustrations for description of the preparation procedure of the liquid jet recording head of the present invention.

Figure 2:
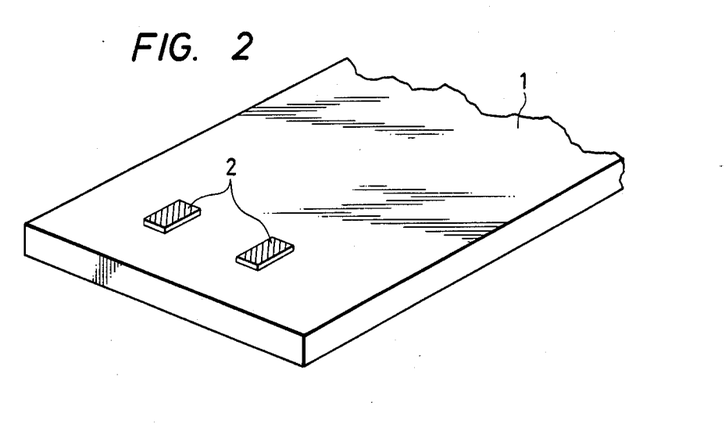

For formation of the liquid jet recording head of the present invention, first, as shown in FIG. 2, a discharge energy generating element 2 such as heat generating element or piezoelectric element is arranged in a desired number on a substrate 1 such as glass, ceramic, plastic or a metal. If desired, for the purpose of imparting resistance to the liquid for recording or electrical insulating property, etc., to the surface of the substrate 1, the surface may be coated with a protective layer of $SiO_2$, $Ta_2O_5$, glass, etc. Also, to the discharge energy generating element 2 is connected electrodes for inputting recording signals, although not shown in the drawing.

Figure 3A:
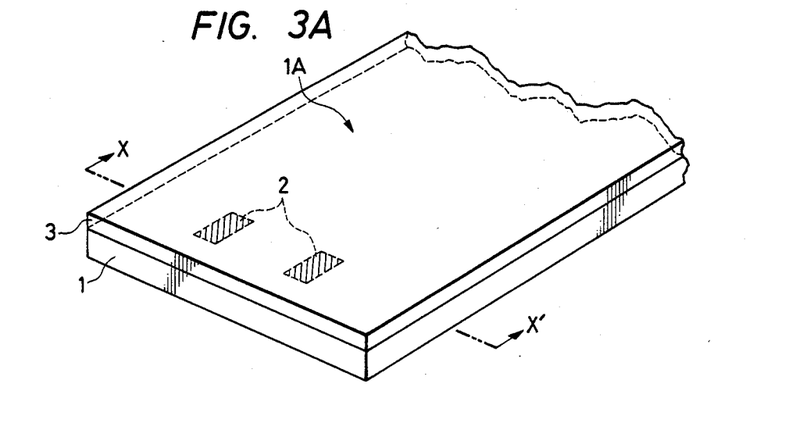
Figure 3B:
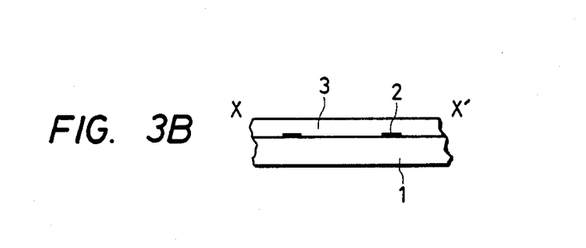

Next, the surface of the substrate 1 obtained after the step shown in FIG. 2 is cleaned and at the same time dried at, for example, 80° to 150° C., and then the active energy ray-curing resin composition 3 as described above of the dry film type (film thickness, about 25 μm to 100 μm), as shown in FIG. 3A and FIG. 3B is heated to about 40° to 150° C. and laminated on the substrate surface 1A at a speed of, for example, 0.5 to 0.4 f/min (about 15.2–about 12.2 cm/min) under the pressurizing condition of 1 to 3 $Kg/cm^2$.

Figure 4:
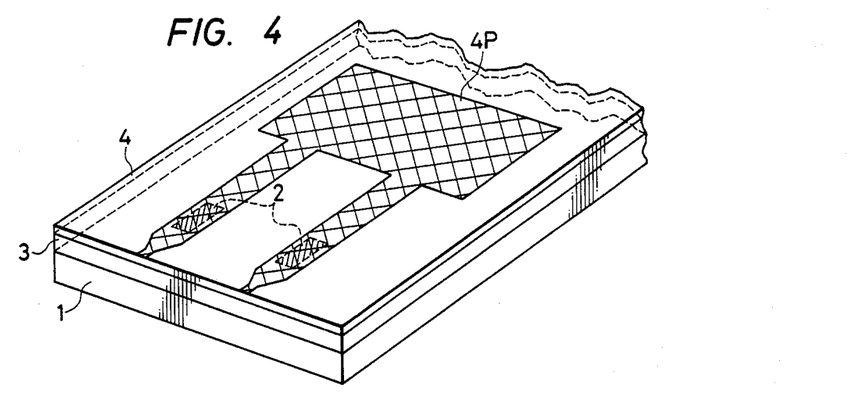

Subsequently, as shown in FIG. 4, on the dry film layer 3 provided on the substrate surface 1A, a photomask 4 having a pattern 4P with a desired shape which does not transmit the active energy ray is superposed, and then exposure is effected from above the photomask 4.

Registration between the photomask 4 and the substrate 1 is effected so that the above element 2 may be positioned in the liquid pathway region finally formed after the steps of exposure and developing processing, etc., for example, according to the method in which registration marks are previously drawn respectively on the substrate 1 and the mask 4 and registration is effected following the marks.

By carrying out such an exposure, the portion other than that covered with the pattern, namely the portion exposed of the dry film layer 3 is cured by polymerization, to become insoluble in a solvent, while the unexposed portion remains soluble in a solvent.

The active energy ray to be used for such a pattern exposure may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 $mW/cm^2$ to 100 $mW/cm^2$ at the wavelength in the vicinity of 365 nm at a distance between the lamp and the material to be irradiated which is practically permissible. The electron beam irradiation device is not particularly limited, but a device having a dose within the range of 0.5 to 20 M Rad is practically suitable.

Figure 5A:
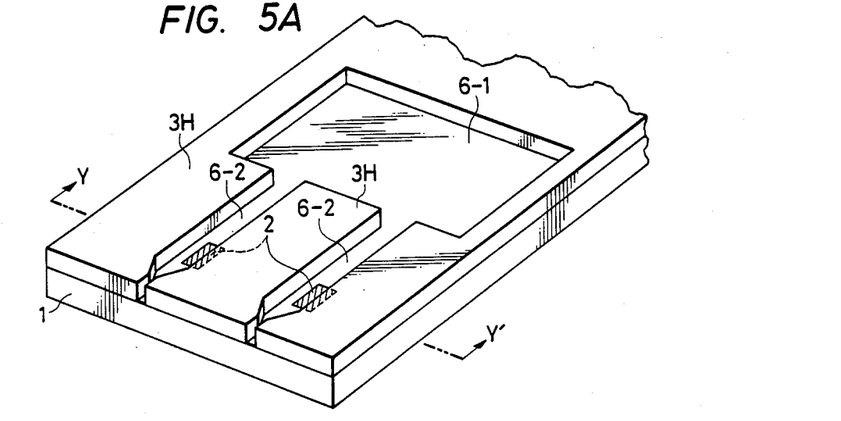
Figure 5B:
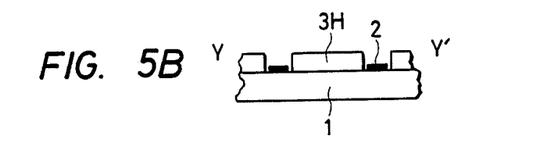

After completion of the pattern exposure of the dry film layer 3, the dry film 3 subjected to exposure is developed by, for example, dipping in a volatile organic solvent such as 1,1,1-trichloroethane, etc., to remove by dissolution the unpolymerized (uncured) portion of the dry film layer 3 which is solvent soluble, thereby forming the grooves which will finally become the liquid pathway 6-2 and liquid chamber 6-1 with the resin cured film 3H remaining on the substrate 1 as shown in FIG. 5A and FIG. 5B.

As the next step, in such a case where a heat curable graft copolymer is used in the active energy ray-curing resin composition the cured resin film 3H on the substrate is subjected to heat polymerization by heating, for example, at a temperature of 100° C. for about 5-10 minutes.

In the recording head of this embodiment, the grooves for liquid pathway 6-2 and liquid chamber 6-1 are formed by referring to an example using a resin composition of the dry film type, namely a solid composition. However, the active energy ray-curing resin composition which can be used in formation of the recording head of the present invention is not limited to only solid compositions, but also a liquid composition may be available.

As the method for forming a layer comprising the composition by use of a liquid resin composition on the substrate, there may be employed, for example, the method according to squeeze as used in preparation of a relief image, namely the method in which a wall with a height corresponding to the desired thickness of the resin composition layer to be formed is provided around the substrate and superfluous resin composition is removed by means of a squeezee, etc. In this case, the resin composition may appropriately have a viscosity of 100 cp to 3000 cp. The height of the wall placed around the substrate is also required to be determined in view of the amount reduced by evaporation of the solvent contained in the light-sensitive resin composition.

When a solid resin composition is employed, it is suitable to use the method in which a dry film is plastered on the substrate by pressure contact under heating.

However, in forming the recording head of the present invention, a solid film type is convenient in handling and also with respect to easy and correct control of the thickness.

Figure 6A:
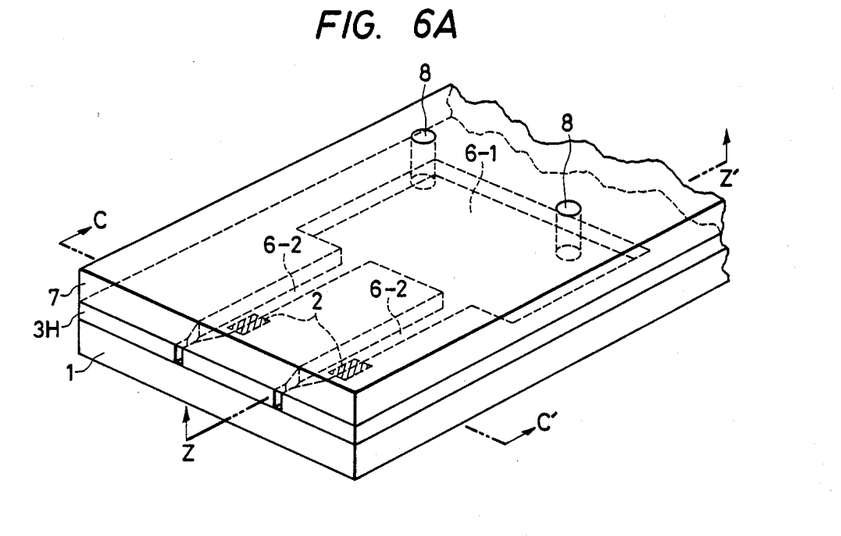
Figure 6B:
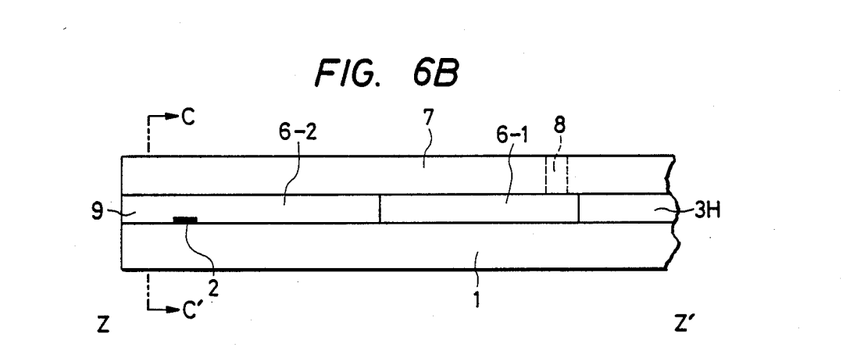

After having thus formed the grooves for constituting finally the liquid pathways 6-2 and the liquid chamber 6-1 with the resin cured film 3H, a flat plate 7 which is a covering over the grooves is bonded with an adhesive on the resin cured film 3H to form a bonded body, as shown in FIG. 6A and FIG. 6B.

In the steps shown in FIG. 6A and FIG. 6B, as the specific method for providing the covering 7, for example, after the flat plate 7 of glass, ceramic, metal, plastic, etc., is applied with an epoxy resin type adhesive by spin coating to a thickness of 3 to 4 μm, the adhesive layer is previously heated to effect the so-called B-staging and then plastered on the cured dry film 3H, followed by main curing of the above adhesive layer. However, it is also possible to use no adhesive such as by having a flat plate 7 of a thermoplastic resin such as acrylic resin, ABS resin, polyethylene, etc., thermally fused directly onto the resin cured film 3H.

It is also preferable to use the method in which a resin layer comprising the resin composition for formation of the resin cured film in the present invention is provided on the covering 7 on the side to be bonded to the liquid pathways the resin layer is thermally fused to the resin cured film 3H having formed liquid pathways thereon and thereafter heated with irradiation of an active energy ray, namely the method of using the resin composition for formation of the resin cured film in the present invention as the adhesive.

In FIGS. 6A and 6B 6-1 shows a liquid chamber, 6-2 liquid pathways and 8 the through-holes for connecting feeding pipes (not shown) for feeding the liquid for recording to the liquid chamber 6-1 from outside of the recording head not shown.

After having completed thus the bonding between the resin cured film 3H provided on the substrate 1 and the flat plate 7, the bonded body is cut along C-C′ positioned on the downstream side of the liquid pathway 6-2 shown in FIG. 6A and FIG. 6B, thereby forming a orifice for discharging the liquid for recording which is the opening portion of the liquid pathway at the cut surface.

This step is conducted for making the interval between the discharge energy generating element 2 and the orifice 9 adequate, and the region to be cut may be selected suitably For this cutting, there may be employed the dicing method, etc., which is conventionally employed in semiconductor industries.

The downstream portion of the liquid pathway as mentioned in the present invention refers to the region on the downstream side in the flow direction of the liquid for recording when recording is performed by use of a recording head, more specifically the portion of the liquid pathway downstream of the position where the discharge energy generating element 2 is located.

After completion of cutting, the cut surface is smoothened by polishing and a feeding pipe 10 is mounted on the through-hole 8 to complete a liquid jet recording head as shown in FIGS. 1A and 1B.

In the recording head as described above, the liquid pathways 6-2 and the liquid chamber 6-1 are formed integrally with a resin cured film 3H, but the recording head of the present invention is not limited to such a structure, and it is also possible to use a structure in which liquid pathways are formed separately from the liquid chamber. However, even if any structure may be taken, the recording head of the present invention is such that at least a part of the resin for forming the liquid pathway is formed by use of the active energy ray-curing resin composition as described above.

The present invention is described in more detail by referring to Synthetic Example and Example. In the following description, parts and % are based on weight unless otherwise particularly noted.

Synthetic Example

Radical chain transfer polymerization of 70 parts of butoxymethylacrylamide and 30 parts of 2-hydroxyethyl methacrylate was conducted by use of thioglycolic acid as the chain transfer agent and azobisisobutyronitrile as the initiator to obtain a macromonomer (poly-butoxymethylacrylamide/2-hydroxyethyl methacrylate) having vinyl group at one terminal end of the molecular chain and a weight average molecular weight of about 3000.

Polymerization of 25 parts of the macromonomer, 55 parts of methyl methacrylate, 15 parts of isobornyl methacrylate and 5 parts of acrylonitrile in methylcellosolve gave a graft copolymer with a weight average molecular weight of 65000 having heat crosslinkability (this is called GP-4).

By use of this GP-4, an active energy ray curable type resin composition having the following composition was prepared.

| | |
|---|---|
| GP-4 | 100 parts |
| Acrylic acid ester of triglycidyl ether of trimethylolpropane | 40 parts |
| Urethane acrylate 11R4003*[3] | 40 parts |
| Riboxy VR-60*[4] | 40 parts |
| Crystal violet | 0.2 parts |
| Irgacure 651 | 10 parts |

| | |
|---|---|
| -continued | |
| Methylcellosolve | 300 parts |

*[3] Urethane acrylate produced by Nagase Kasei K.K.
*[4] Epoxyacrylate produced by Showa Kobunshi K.K.

Next, the above resin composition was coated by a wire bar onto a 16 μm polyethylene terephthalate film, followed by drying at 100° C. for 20 minutes to form a dry film according to the present invention having a resin composition layer with a film thickness of 75 μm.

EXAMPLE

By use of the dry film prepared in Synthetic example, following the steps of FIG. 1 to FIG. 6 as described previously in the specification, an on-demand type liquid jet recording head having 10 orifices (orifice dimension: 75 μm×50 μm, pitch 0.125 mm) with heat generating elements [hafnium boride ($HfB_2$)] as the discharge energy generating element was prepared as follows. The recording head was prepared in number of 30 respectively of the same shape.

First, a plurality of heat generating elements were arranged at the predetermined positions on the substrate comprising silicon and electrodes for applying recording signals were connected to these.

Next, an $SiO_2$ layer (thickness 1.0 μm) as the protective film was provided on the substrate surface having the heat generating elements arranged thereon, and the surface of the protective layer was cleaned and dried. Then, the dry film of 75 μm thickness obtained in the above Synthetic example, heated to 80° C. was laminated on the protective layer at a speed of 0.4 f/min. under the pressurizing condition of 1 kg/cm².

Subsequently, on the dry film provided on the substrate surface, a photomask having a pattern corresponding to the shapes of liquid pathways and liquid chamber was superposed and, after performing registration so that the above element may be provided in the liquid pathways to be finally formed, the dry film was exposed to UV-RAY with an intensity of 8.2 mW/cm² from above the photomask for 15 seconds.

Next, the exposed dry film subjected to development by dipping it in 1,1,1-trichloroethane to remove by dissolution the unpolymerized (uncured) portion of the dry film from the substrate, thereby forming grooves which will become finally the liquid pathways and liquid chamber with the cured dry film.

After completion of development, the cured dry film on the substrate was heated at 150° C. for one hour, and further cured by irradiation of UV-ray with an intensity of 50 mW/cm² for 2 minutes After having formed thus the grooves for the liquid pathways and liquid chamber with the cured dry film, a flat plate comprising soda glass provided with a through-hole which becomes the covering over the groove formed was applied with an epoxy type resin adhesive to a thickness of 3 μm by spin coating, then preheated to effect B-staging and plastered on the cured dry film, followed further by main curing of the adhesive to effect adhesion fixing, thus forming a bonded body.

Subsequently, on the downstream side of the liquid pathway of the bonded body, namely at the position of 0.150 mm toward the downstream side from the position where the discharge energy generating element is located, the bonded body was cut vertically relative to the liquid pathway by means of a commercially available dicing saw (trade name DAD 2H/6 model, produced by DISCO Co.) to form orifices for discharging the liquid for recording.

Finally, the cut surfaces were washed and dried, further smoothened by polishing, and feeding pipes for feeding the liquid for recording were mounted at the through-holes to complete the liquid jet recording head. Everyone of the recording heads obtained was found to have liquid pathways and liquid chamber which have faithfully reproduced the mask pattern and to be excellent in dimensional precision. The orifice dimension was within 50±5 μm and an orifice pitch within 125±5 μm.

The recording heads thus prepared were tested for quality and durability during prolonged use as follows.

First, for the recording heads obtained, durability test was conducted by dipping in the liquids for recording having the respective compositions shown below at 60° C. for 1000 hours (the environmental conditions comparable to prolonged use of recording head).

Liquid components for recording

| | | |
|---|---|---|
| 1 | $H_2O$/diethylene glycol/glycerine/C.I. Direct Black 154*[1] (= 70/20/5/5/weight parts) | pH = 8.0 |
| 2 | $H_2O$/ethylene glycol/N—methylpyrrolidone/ C.I. Direct Blue 199*[2] (= 60/25/10/5 weight parts) | pH = 9.0 |
| 3 | $H_2O$/ethylene glycol/triethylene glycol/ C.I. Acid Red 94*[3] (= 60/25/10/5 weight parts) | pH = 7.0 |
| 4 | $H_2O$/diethylene glycol/C.I. Direct Black 154 (= 75/20/5 weight parts) | pH = 10.0 |

Note
*[1]-*[3] are water-soluble dyes, and sodium hydroxide was used for control of pH.

For each liquid for recording, 5 recording heads were provided for durability test.

After the durability test, each head subjected to said test was observed about the bonded state between substrate and the covering and the dry film. As the result, no peel-off or damage could be recognized in all of the recording heads, but good adhesiveness was exhibited.

Next, separately for the other 10 recording heads obtained, each head was mounted on a recording device, and the printing test was practiced by use of the above liquid for recording by applying recording signals of $10^8$ pulse continuously on the recording head for 14 hours. For each recording head, immediately after initiation of printing and after elapse of 14 hours, substantially no lowering in both of the discharging performance of the liquid for recording and printed state can be recognized. Thus, the recording head was found to be excellent in durability.

COMPARATIVE EXAMPLE 1

Recording heads were prepared in the same manner as Example 1 except for using a commercially available dry film Vacrel with a thickness of 75 μm (trade name of dry film solder mask, produced by Du Pont de Nemours Co.) and a commercially available dry film Photec SR-3000 with a film thickness of 50 μm (trade name, produced by Hitachi Kasei Kogyo K.K.).

For these recording heads, the same durability test as Example 1 was practiced.

In the course of durability test, when employing Vacrel as the dry film, peel-off was recognized after 100 hours with the liquids for recording (2) and (4). Also, after 300 hours, peel-off was recognized with the liquids for recording (1) and (3).

On the other hand, when employing Photec SR-3000 as the dry film, peel-off was recognized after 300 hours with a respective liquids for recording of (1) to (4)

The liquid jet recording head of the present invention employs as the active energy ray curable type resin composition which is the constituent member of the head a material having excellent sensitivity and resolving power as the pattern forming material imparted primarily by the monomer having ethylenically unsaturated bond contained as the essential component in the composition, and by use of the resin composition, it has been rendered possible to obtain a liquid jet recording head excellent in dimensional precision with good yield. Also, the resin composition to be used in the present invention has also excellent adhesion to the substrate, mechanical strength and chemical resistance imparted primarily by the graft copolymer as the essential component, and by use of the composition it has also rendered possible to obtain a recording head having durability over a long term.

Also, in the case when employing the active energy ray curable type resin composition by use of a graft copolymer having curability, it is possible to obtain a liquid jet recording head which is particularly excellent in the adhesion, mechanical strength or chemical resistance.

We claim:

1. A liquid jet recording head, having a liquid pathway communicated to the discharging outlet of the liquid provided on a substrate surface, said pathway being formed by subjecting a layer of a resin composition curable with an active energy ray to a predetermined pattern exposure with the use of said active energy ray to thereby form a cured region of said resin composition and removing the uncured region from said layer, said resin composition being an active energy ray curable resin composition comprising;

(A) a graft copolymerized polymer comprising trunk chains comprising a monomer represented by the general formula (I) shown below:

(wherein $R_1$ to $R_8$ each represent hydrogen or methyl group) and at least one monomer selected from the group consisting of alkyl (meth)acrylate, acrylonitride and styrene, having graft chains composed mainly of structural units derived from at least one monomer selected from the group consisting of (a) hydroxyl containing (meth)acrylic monomers, (b) amino or alkylamino containing (meth)acrylic monomer, (c) carboxyl containing (meth)acrylic or vinyl monomers, (d) N-vinylpyrrolidone, (e) vinylpyridine or its derivatives and (f) (meth)acrylamide derivatives represented by the following general formula (II):

(wherein $R^1$ is hydrogen or methyl group, and $R^2$ is hydrogen or alkyl or acyl group having 1 to 4 carbon atoms which may have hydroxy group.), added to said trunk chains; and (B) a monomer having an ethylenically unsaturated bond.

2. The recording head according to claim 1, wherein the active energy ray-curable resin composition contains 20 to 80 parts by weight of the graft copolymerized polymer (A) and 80 to 20 parts by weight of the monomer having an etylenically unsaturated bond (B).

3. The recording head according to claim 1, wherein the proportion of the monomer represented by the formula (I) formulated in the graft copolymerized polymer (A) is within the range of from 1 to 30% by weight.

4. The recording head according to claim 1, wherein said monomer having an ethylenically unsaturated bond has a boiling point of 100° C. or higher under the atmospheric pressure and at least two ethlenically unsaturated bonds.

5. The recording head according to claim 1, wherein said monomer having an ethylenically unsaturated bond is selected from the group consisting of (i) (meth)acrylic acid esters of polyfunctional epoxy resins having two or more epoxy groups in one molecule; (ii) (meth)acrylic acid esters of alkyleneoxide addition products of polyhydric alcohols; (iii) polyester (meth) acrylates having (meth)acrylic acid ester group at the terminal ends of the molecular chains of polyesters having molecular weights of 500 to 3000 comprising dibasic acid and dihydric alcohol; and (iv) the reaction products between polyisocyanates and (meth)acrylic acid monomers having hydroxyl groups.

6. The recording head according to claim 4, wherein the active energy ray-curable resin composition further comprises a monomer having only one ethlenically unsaturated bond.

7. The recording head according to claim 1, wherein the active energy ray-curable resin composition further comprises a monomer which is subjected to ring opening by heat to be crosslinked.

8. The recording head according to claim 7, wherein the monomer is glycidyl (meth)acrylate.

9. The recording head according to claim 1, wherein a photopolymerizable monomer is added to some of the graft chains of said graft copolymerized polymer.

10. The recording head according to claim 1, wherein a hydrophobic monomer is contained within the range of 0 to about 25% by weight as a component of comonomers in said graft copolymerized polymer.

11. The recording head according to claim 1, wherein the active energy ray-curable resin composition further comprises a photopolymerization initiator.

12. The recording head according to claim 1, wherein the active energy ray-curable resin composition further comprises 0.1 to 20 parts by weight of a photopolymerization initiator based on 100 parts by weight of the total amount of the graft copolymerized polymer (A) and the monomer having an ethylenically unsaturated bond (B).

13. The recording head according to claim 11, wherein the photopolymerization initiator is a compound selected from the group consisting of benzil, benzoin alkyl ethers, benzophenones, anthraquinones, xanthones and acetophenones.

14. The recording head according to claim 11, wherein the active energy ray-curable resin composition further comprises a photopolymerization accelerator.

15. The recording head according to claim 14, wherein the photopolymerization accelerator is an amino compound.

16. The recording head according to claim 1, wherein the active energy ray-curable resin composition further comprises an additive selected from the group consisting of catalysts for condensation cross-linking, heat polymerization inhibitors, colorants, fine particulate fillers, adhesion promotors, and plasticizers.

17. The recording head according to claim 16, wherein the catalyst for condensation cross-linking is selected from the group consisting of sulfonic acids and carboxylic acids.

18. The recording head according to claim 16, wherein the heat polymerization inhibitor is selected from the group consisting of hydroquinone and its derivatives p-ethoxyphenol, and phenothiazine.

19. The recording head according to claim 16, wherein the colorant is selected from the group consisting of oil-soluble dyes and pigments.

20. The recording head according to claim 16, wherein the fine particulate filler is selected from the group consisting of extender pigments and fine plastic particles.

21. The recording head according to claim 16, wherein the adhesion promotor is selected from the group consisting of silane coupling agents and low molecular surfactants.

22. The recording head according to claim 1, wherein said graft copolymerized polymer has a weight-average molecular weight of about 5000 to about 300,000.

* * * * *

UNITED STATES PATENT AND TRADEMARK OFFICE
CERTIFICATE OF CORRECTION

PATENT NO. : 4,839,669
DATED : June 13, 1989
INVENTOR(S) : YASUFUMI SATO ET AL.

Page 1 of 4

It is certified that error appears in the above-identified patent and that said Letters Patent is hereby corrected as shown below:

AT [57] ABSTRACT

Line 6, "as" should read --of--.
Line 5, "comprises;" should read --comprising--.
Line 16, "arcylic monomers," should read --acrylic monomers,--.
Line 25, "group.)," should read --group),--.

COLUMN 1

Line 16, "as-ink," should read --as ink--.
Line 19, "noize" should read --noise--.
Line 42, "have" should read --has--.

COLUMN 2

Line 42, "requires" should read --require--.
Line 43, "time" should read --time.--.

COLUMN 3

Line 12, "below" should read --below:--.
Line 34, "general formula (II)" should read ----general formula (II):--.
Line 44, "group.)," should read --group),--.
Line 59, "recording head" should read --a recording head--.

COLUMN 4

Line 30, "liquid patheays 6-2" should read --liquid pathways 6-2--.

UNITED STATES PATENT AND TRADEMARK OFFICE
CERTIFICATE OF CORRECTION

PATENT NO. : 4,839,669
DATED : June 13, 1989
INVENTOR(S) : YASUFUMI SATO ET AL.

Page 2 of 4

It is certified that error appears in the above-identified patent and that said Letters Patent is hereby corrected as shown below:

COLUMN 5

Line 17, "(meth)-acrylic monomers," should read --(meth)acrylic monomers,--.
Line 19, "N-vinylpyrrolidone,(e)" should read --N-vinylpyrrolidone, (e)--.
Line 52, "copolyer (A)" should read --copolymer A--.

COLUMN 7

Line 44, "d the" should read --(d) the--.
Line 48, "cross" should read --cross---.
Line 64, "mononers," should read --monomers--.

COLUMN 8

Line 57, "urethanemodified" should read --urethane-modified--.
Line 68, "mula 111:" should read --mula III:--.

COLUMN 9

Line 19, "etyleneglycol di(meth)acrylate," should read --ethyleneglycol di(meth)acrylate,--.
Line 42, "trimethylhexanethylene dissocyanate," should read --trimethylhexanethylene diisocyanate,--.
Line 44, "(metha)acrylic" should read --(meth)acrylic--.
Line 50, "thyolpropane" should read --thylopropane---.
Line 56, "noners" should read --nomers--.

UNITED STATES PATENT AND TRADEMARK OFFICE
CERTIFICATE OF CORRECTION

PATENT NO. : 4,839,669
DATED : June 13, 1989
INVENTOR(S) : YASUFUMI SATO ET AL.

Page 3 of 4

It is certified that error appears in the above-identified patent and that said Letters Patent is hereby corrected as shown below:

COLUMN 10

Line 14, "lene-glycol" should read --leneglycol--.
Line 22, "acetate." should read --acetate,--.
Line 23, "crylamide." should read --crylamide,--.
Line 25, "$\xi$-caploractone-modified" should read --$\epsilon$-caprolactone-modified--.
Line 36, "40nm" should read --450nm--.
Line 56, "1 (4-isopropyl-" should read --1-(4-isopropyl---.
Line 59, "methyl-1 phenylpropane 1-one" should read --methyl-1=phenylpropane 1-one--.
Line 61, "photopolymerication" should read --photopolymerization--.

COLUMM 11

Line 6, "ehylenically" should read --ethylenically--.
Line 22, "ployed" should read --ployed.--.
Line 48, "transmission" should read --transmission of--.

COLUMN 13

Line 16, "squeeze" should read --squeegee--.
Line 21, "squeezee" should read --squeegee--.
Line 57, "pathways" should read --pathways,--.
Line 58, "pathways-" should read --pathways--.

COLUMN 14

Line 12, "suitably" should read --suitably.--.

UNITED STATES PATENT AND TRADEMARK OFFICE
CERTIFICATE OF CORRECTION

PATENT NO. : 4,839,669
DATED : June 13, 1989
INVENTOR(S) : YASUFUMI SATO ET AL.

It is certified that error appears in the above-identified patent and that said Letters Patent is hereby corrected as shown below:

COLUMN 16

Line 7, "Everyone" should read --Every one--.
    Line 8, "liquid chamber" should read --liquid chambers--.
    Line 39, "all" should read --any--.

COLUMN 17

Line 3, "a" should read --the--.

COLUMN 18

Line 9, "group.)," should read --group),--.
    Line 17, "etylenically" should read --ethylenically--.
    Line 25, "ethlenically" should read --ethylenically--.
    Line 42, "ethlenically" should read --ethylenically--.

Signed and Sealed this

Ninth Day of July, 1991

Attest:

HARRY F. MANBECK, JR.

*Attesting Officer*

*Commissioner of Patents and Trademarks*